US011633673B2

(12) United States Patent
Goergen et al.

(10) Patent No.: US 11,633,673 B2
(45) Date of Patent: Apr. 25, 2023

(54) MODULAR AMUSEMENT PARK SYSTEMS AND METHODS

(71) Applicant: Universal City Studios LLC, Universal City, CA (US)

(72) Inventors: Patrick John Goergen, Orlando, FL (US); Danielle Marie Holstine, Winter Garden, FL (US); Tomas Manuel Trujillo, Orlando, FL (US)

(73) Assignee: Universal City Studios LLC, Universal City, CA (US)

( * ) Notice: Subject to any disclaimer, the term of this patent is extended or adjusted under 35 U.S.C. 154(b) by 362 days.

(21) Appl. No.: 15/991,604

(22) Filed: May 29, 2018

(65) Prior Publication Data

US 2019/0351340 A1 Nov. 21, 2019

Related U.S. Application Data

(60) Provisional application No. 62/672,918, filed on May 17, 2018.

(51) Int. Cl.
*G06F 3/01* (2006.01)
*A63G 31/02* (2006.01)
(Continued)

(52) U.S. Cl.
CPC .............. *A63G 31/02* (2013.01); *G06F 3/011* (2013.01); *G06F 8/65* (2013.01); *G06F 9/54* (2013.01); *H05K 7/1428* (2013.01)

(58) Field of Classification Search
CPC ................. G06F 9/44; A63G 31/02
See application file for complete search history.

(56) References Cited

U.S. PATENT DOCUMENTS 5,403,238 A 4/1995 Baxter et al.
7,613,902 B1 * 11/2009 Martin ................ G06F 15/7867
712/201

(Continued)

FOREIGN PATENT DOCUMENTS

CN 1684747 A 10/2005
CN 101510074 A 8/2009
(Continued)

OTHER PUBLICATIONS

PCT/US2019/019277 Search Report and Written Opinion dated May 14, 2019.

(Continued)

*Primary Examiner* — Phil K Nguyen
(74) *Attorney, Agent, or Firm* — Fletcher Yoder, P.C.

(57) ABSTRACT

A system in accordance with present embodiments includes an amusement park system having one or more hardware components and a controller. The controller includes a memory device having a game layer and a software layer stored thereon. The game layer includes game logic, and the software layer includes a game API communicatively coupled to the game layer, a wrapper API communicatively coupled to the game API, and multiple wrappers communicatively coupled to the wrapper API. The controller further includes a processor configured to execute instructions to cause the processor to receive a signal indicative of a change in the hardware components, and, based on the signal indicative of the change in the hardware components, communicate with the hardware components via a wrapper to receive an input from the hardware components, or drive operation of the hardware components.

18 Claims, 3 Drawing Sheets

(51) Int. Cl.
  *H05K 7/14* (2006.01)
  *G06F 9/54* (2006.01)
  *G06F 8/65* (2018.01)

(56) References Cited

U.S. PATENT DOCUMENTS

| | | | |
|---|---|---|---|
| 8,359,585 B1 | 1/2013 | Spinner et al. | |
| 8,435,121 B1* | 5/2013 | Fisher | A63F 13/355 |
| | | | 463/42 |
| 9,072,067 B2* | 6/2015 | Shimizu | G01S 5/0242 |
| 9,908,056 B2 | 3/2018 | Maycock et al. | |
| 9,943,759 B2 | 4/2018 | Boyle | |
| 10,207,193 B2 | 2/2019 | Stenzler et al. | |
| 2001/0037745 A1 | 11/2001 | Mares | |
| 2003/0225929 A1 | 12/2003 | Adams | |
| 2005/0220286 A1* | 10/2005 | Valdez | H04M 1/2535 |
| | | | 379/211.02 |
| 2005/0228628 A1* | 10/2005 | Bellantoni | G06F 30/33 |
| | | | 703/13 |
| 2006/0090064 A1* | 4/2006 | Michaelis | G06F 11/1658 |
| | | | 714/E11.061 |
| 2006/0156289 A1 | 7/2006 | Spinner | |
| 2006/0160626 A1* | 7/2006 | Gatto | A63F 13/71 |
| | | | 463/43 |
| 2006/0264256 A1* | 11/2006 | Gagner | G07F 17/3232 |
| | | | 463/20 |
| 2007/0167210 A1* | 7/2007 | Kelly | G07F 17/32 |
| | | | 463/16 |
| 2010/0095250 A1* | 4/2010 | Roberto | H04L 67/75 |
| | | | 715/863 |
| 2010/0205599 A1 | 8/2010 | Vaidya et al. | |
| 2010/0325392 A1* | 12/2010 | Kim | G06F 9/541 |
| | | | 712/33 |
| 2011/0110416 A1* | 5/2011 | Lawrence | G07F 17/32 |
| | | | 375/240.01 |
| 2012/0072774 A1 | 3/2012 | Spinner | |
| 2012/0146893 A1* | 6/2012 | Maas | G07F 17/3216 |
| | | | 345/156 |
| 2012/0196661 A1* | 8/2012 | Snoddy | A63F 9/0612 |
| | | | 463/9 |
| 2014/0013048 A1* | 1/2014 | Biederman | G06F 11/108 |
| | | | 711/114 |
| 2014/0351774 A1* | 11/2014 | Seidner | G06F 30/30 |
| | | | 716/102 |
| 2016/0282921 A1* | 9/2016 | Kodavalla | G06F 1/324 |
| 2017/0010952 A1* | 1/2017 | Nandakumar | G06F 8/30 |
| 2017/0012821 A1 | 1/2017 | Sa | |
| 2018/0018464 A1 | 1/2018 | Tadic et al. | |
| 2018/0053349 A1 | 2/2018 | Chen et al. | |
| 2019/0020720 A1* | 1/2019 | Stahle | H04L 67/125 |
| 2019/0034478 A1* | 1/2019 | Dolbear | G06F 8/65 |
| 2019/0180041 A1* | 6/2019 | Bhunia | G06F 13/28 |

FOREIGN PATENT DOCUMENTS

| | | |
|---|---|---|
| CN | 101801483 A | 8/2010 |
| CN | 106061571 A | 10/2016 |
| CN | 106068148 A | 11/2016 |
| CN | 106457047 A | 2/2017 |
| CN | 106659940 A | 5/2017 |
| FR | 2954173 A1 | 6/2011 |
| JP | 2017156956 A | 9/2017 |

OTHER PUBLICATIONS

Stark, Harold, "Can Software Virtualization Bridge The Gap Between Technologies?" Forbes, Dec. 2, 2016. https://www.forbes.com/sites/haroldstark/2016/12/02/can-software-virtualization-bridge-the-increasing-gap-between-devices-and-technologies/#56e5cfa34d5c.
Sandborn, Peter; "Software Obsolescence—Complicating the Part and Technology Obsolescence Management Problem," IEEE Trans on Components and Packaging Technologies, vol. 30, No. 4, pp. 886-888, Dec. 2007.
CN 201980033044.5 Office Action dated Mar. 1, 2022.
JP Office Action for Japanese Application No. 2020-564077 dated Mar. 1, 2023.

* cited by examiner

MODULAR AMUSEMENT PARK SYSTEMS AND METHODS

CROSS REFERENCE TO RELATED APPLICATION

This application is a Non-Provisional Application claiming priority to U.S. Provisional Application No. 62/672,918, entitled "MODULAR AMUSEMENT PARK SYSTEMS AND METHODS," filed May 17, 2018, which is hereby incorporated by reference in its entirety for all purposes.

FIELD OF DISCLOSURE

The present disclosure relates generally to the field of amusement parks. More specifically, embodiments of the present disclosure generally relate to technological refreshes and updates within amusement parks.

BACKGROUND

Since the early twentieth century, amusement parks (or theme parks) have substantially grown in popularity. With the rise in popularity, amusement parks may constantly undergo construction/maintenance as new attractions are implemented and existing attractions are updated. With the increasing sophistication and complexity of modern attractions, and the corresponding increase in expectations among amusement park patrons, improved systems and methods are needed to accommodate technological refreshes and/or updates, which may cause increased downtime of the attractions.

SUMMARY

Certain embodiments commensurate in scope with the originally claimed subject matter are summarized below. These embodiments are not intended to limit the scope of the disclosure, but rather these embodiments are intended only to provide a brief summary of certain disclosed embodiments. Indeed, the present disclosure may encompass a variety of forms that may be similar to or different from the embodiments set forth below.

In accordance with one embodiment, a system includes an amusement park system having one or more hardware components and a controller. The controller includes a memory device having a game layer and a software layer stored thereon. The game layer includes game logic, and the software layer includes a game application programming interface (API) communicatively coupled to the game layer, a wrapper API communicatively coupled to the game API, and multiple wrappers communicatively coupled to the wrapper API. The controller further includes a processor configured to execute instructions stored on the memory device. The instructions are configured to cause the processor to receive a signal indicative of a change in the one or more hardware components of the amusement park system, and, based on the signal indicative of the change in the hardware component, communicate with the one or more hardware components via a wrapper of the multiple wrappers to receive an input from the one or more hardware components, or drive operation of the one or more hardware components.

In another embodiment, an amusement park configured to host a plurality of users includes a plurality of attractions. Each attraction of the plurality of attractions includes multiple interactive components configured to interact with the plurality of users. The amusement park further includes a controller having a memory device and a processor configured to execute instructions stored on the memory device. The instructions are configured to cause the processor to: receive a signal indicative of an implementation of a new interactive component within an attraction of the plurality of attractions; and register the new interactive component upon receipt of the signal. Upon registration of the new interactive component, the processor is configured to process input signals received from the new interactive component, drive operations of the new interactive component, or a combination thereof.

In another embodiment, a method includes removing a first component from at least one connection of an amusement park. The first component is associated with a first set of functions. The method further includes implementing a second component of the amusement park utilizing the at least one connection. The second component is associated with a second set of functions, and the first set of functions is different than the second set of functions. The method also includes registering the second component with an amusement park system of the amusement park such that the second set of functions of the second component is configured to be selectively driven according to one or more input signals from a controller of the amusement park.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

The present disclosure provides systems and methods to rapidly update (e.g., refresh) attractions and other entertainment features in amusement parks through facilitating modularity and separability of hardware components. Provided herein are system architectures that support such modularity and that facilitate interoperability between hardware components that perform different functions within an attraction, but whose operation may interrelate to one other. In certain embodiments, a system architecture of an amusement park may include a game layer, a software architecture (e.g., 'software') layer, and a hardware architecture (e.g., 'hardware') layer. The game layer may communicate logic of a particular game and/or ride attraction to the software layer, which in turn communicates the game logic to the hardware layer to implement the game logic via one or more hardware devices. That is, the software layer may utilize protocols in the form of application programming interfaces (APIs) and wrappers to effectively communicate the game logic to drivers of the hardware in the hardware layer. Due at least to the separation between the game layer, the software layer, and the hardware layer, the amusement park may update various portions (e.g., hardware and/or software components) of the architecture with minimal impact on the overall system of the amusement park.

To illustrate, a new hardware component may be implemented (e.g., plugged in) within an attraction of the amusement park. The hardware component may be an input device and/or an output peripheral device. When the new hardware component is implemented within the attraction, the hardware component may be automatically registered with the system such that the hardware component may generate and/or receive events (e.g., communicate with other components of the amusement park). Indeed, implementation of a hardware component may occur seamlessly, such as without a substantial overhaul of the existing attraction and/or without additional reconfiguration of the system by a technician. Once implemented and registered, the hardware component may be configured to react to a variety of stimulus messages, which may stem from the game logic of the game layer. Thus, the attraction may also implement new game logic and/or new software components while utilizing existing hardware. For example, a particular attraction may utilize a game surface and a plurality of other hardware devices, such as ride vehicles, virtual reality headsets, and so forth to implement a first game. Upon implementation of the new game logic and/or new software components, the same particular attraction may implement a second game utilizing the existing game surface and plurality of other hardware devices.

In one embodiment, certain hardware components may permit guest input that in turn impacts the operation of another hardware element within an attraction to cause a particular output (e.g., an input from a guest weapon may cause a fixed target to light up or otherwise indicate a successful hit). As technology improves, or as the attraction narrative becomes more complex, the attraction may be updated with new hardware components, such as new weapons hardware, which may entice guests to revisit the attraction. However, replacing the fixed elements, such as fixed targets, may be more costly, particularly if such targets include actuating components. Thus, certain hardware components (e.g., the fixed targets) may remain in place even when other hardware components (e.g., weapons) are replaced. Accordingly, in one embodiment and by way of example, the present techniques provide a system architecture that includes hardware wrappers or other communication protocols that permit new hardware components to communicate with existing hardware components without adjustments to the protocols in place and/or to the existing hardware components. In this manner, hardware components, such as weapons hardware, may be replaced. New weapons may be slotted into the system to communicate with existing fixed targets without updating or changing the existing system architecture and/or communication protocols.

The disclosed attraction systems and methods may be implemented with amusement park attractions including shows, rides, promotions, and so forth. By employing a modular architecture within the amusement park attractions, the attractions may easily and constantly be updated and refreshed as new technologies emerge. Accordingly, guests are incentivized to visit the amusement park and are further enabled to enjoy the thematic experience provided by the amusement park as attractions are frequently changed and updated.

Figure 1:
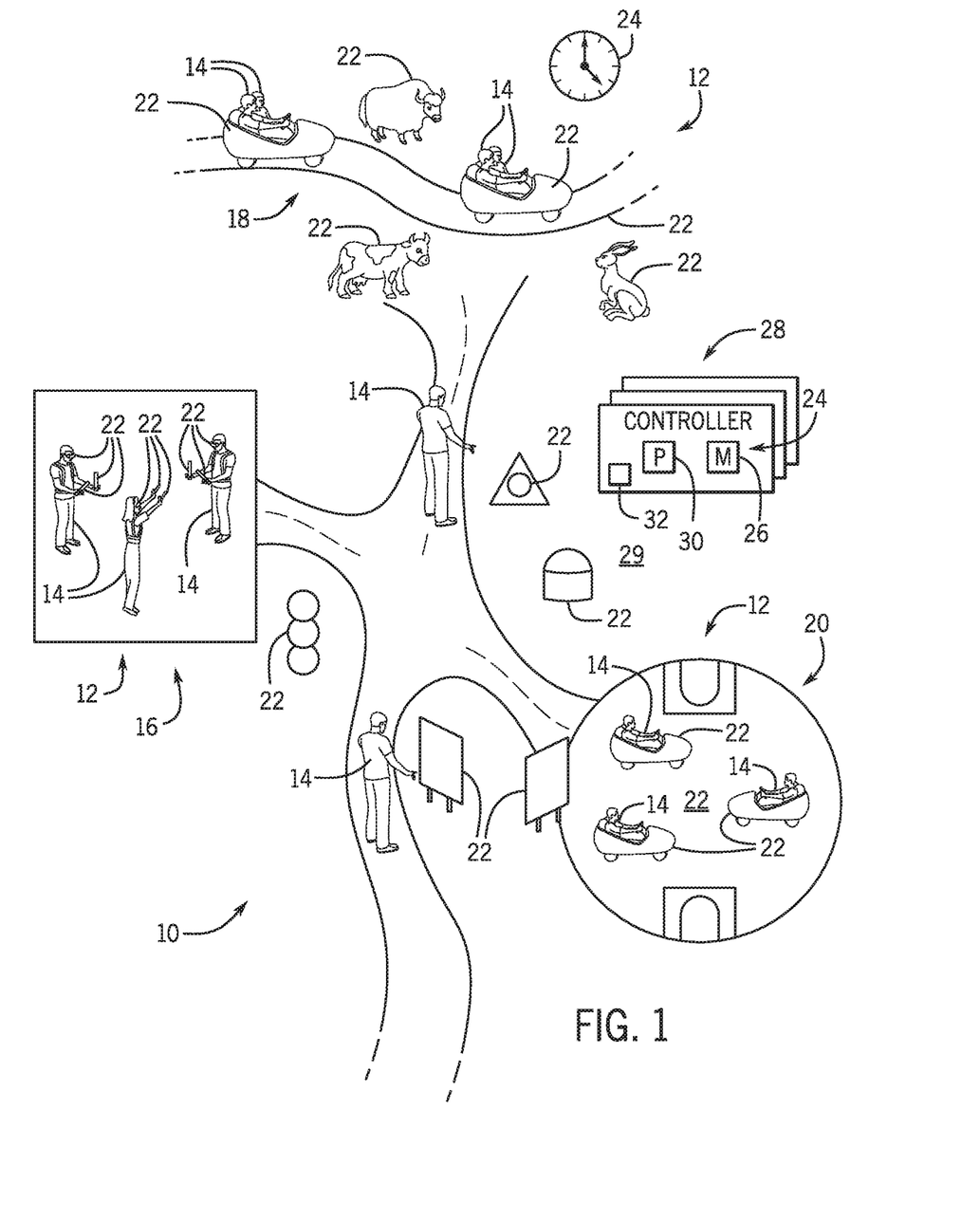
FIG. 1 is a schematic view of an amusement park having a modular architecture, in accordance with an embodiment of the present disclosure.

With the foregoing in mind, FIG. 1 illustrates an embodiment of an amusement park 10, which may include one or more attractions 12. Each attraction 12 may accommodate a plurality of users 14 (e.g., guests, patrons). As discussed herein, the amusement park 10 may utilize a multi-layer system infrastructure to accommodate technological refreshes, updates, and so forth while minimizing downtime and impact of overall aesthetics and operations of the amusement park 10. Particularly, modularity of the multi-layer system infrastructure may provide for a change (e.g., an update, a replacement, an addition, and/or a removal) of one or more hardware or software components without substantially affecting other elements (e.g., other hardware or software components) of the system.

To illustrate, in certain embodiments, the amusement park 10 may include a first attraction 16, a second attraction 18, and a third attraction 20. However, it should be understood that the amusement park 10 may include any suitable number of attractions 12. Each attraction 12 may include any suitable number of hardware components 22, such as physical components that may interact (e.g., communicate) with software components 24, which may be stored in a memory device 26 of one or more controllers 28 to perform tasks associated with a particular attraction 12, as discussed in further detail herein. Indeed, there may be any suitable number of controllers 28. In certain embodiments, each attraction 12 may be associated with a respective controller 28. The amusement park 10 may further include one or more hardware components 22 within an environment 29 (e.g., queues) of the amusement park 10, which may also be communicatively coupled to the one or more controllers 28. In certain embodiments, the environment 29 may include the attractions 12.

The controller 28 may employ a processor 30, which may represent one or more processors, such as an application-specific processor. The controller 28 may also include the memory device 26 for storing instructions executable by the processor 30 to perform the methods and control actions of the amusement park 10 as described herein. The processor 30 may include one or more processing devices, and the memory 26 may include one or more tangible, non-transitory, machine-readable media. By way of example, such machine-readable media can include RAM, ROM, EPROM, EEPROM, CD-ROM, or other optical disk storage, magnetic disk storage or other magnetic storage devices, or any other medium that can be used to carry or store desired program code in the form of machine-executable instructions or data structures and that may be accessed by the processor 30 or by any general purpose or special purpose computer or other machine with a processor.

The controller 28 may be communicatively coupled to elements of the amusement park 10 through a communication system 32. In some embodiments, the communication system 32 may communicate through a wireless network, such as wireless local area networks [WLAN], wireless wide area networks [WWAN], near field communication [NFC], or Bluetooth. In some embodiments, the communication system 32 may communicate through a wired network such as local area networks [LAN], or wide area networks [WAN]. In some embodiments, the communication system 32 may communicate through lights/lasers, sounds, quantum mechanics, or other environmental stimuli.

Each hardware component 22 (e.g., peripheral device) may be categorized as an input device and/or an output device peripheral device. That is, each hardware component 22 may be an input device, an output device, or an input/output device. An input device may receive an input, such as from one of the plurality of users 14, and send input signals indicative of the received input to the controller 28. The hardware components 22 may include interactive components, and the input may be received via one or more user input devices (buttons, knobs, touchscreens, joysticks, actuatable elements, steering controls, triggers, etc.) of the interactive components. Correspondingly, and as a result of the input signals, the output devices may receive the input signals, which may be received from the controller 28 and/or directly from the input devices. For example, the controller 28 may then, in turn, send one or more signals to one or more locations, such as the output devices, within the amusement park 10 to provide an appropriate response according to the received input. The output devices may react accordingly to the signal, such as through actuation of a device or through display of images/information via a display device. For example, with regard to hardware components 22 of the first attraction 16, input devices may include VR devices such as VR tools and VR googles, and output devices may include the VR goggles as images are displayed via the VR goggles. With regard to hardware components 22 of the second attraction 18, input devices may include ride devices (e.g., tools) that the users 14 may interact with during a ride cycle and output devices may include animatronic show pieces and ride vehicles. With regard to the hardware components 22 of the third attraction 20, input devices may include steering wheels and output devices may include a scoreboard, and a game floor display. However, it is to be understood that the amusement park 10 may include any suitable number of attractions 12 with any suitable number and type of hardware components 22. Further, VR devices may serve as input/output devices that facilitate user interaction with the attraction 12 to generate the input and cause another hardware element to output a response. In turn, the response may also trigger output changes to the display of the VR devices. As used herein, VR may refer to augmented reality, virtual reality, mixed reality, or a combination thereof.

Each of the hardware components 22 and software components 24 may be replaced or updated based on various factors. For example, emerging technologies, movies or other media releases, seasonal change, time of day, routine maintenance, or any combination thereof may motivate a change to the hardware components 22 and/or software components 24 of the amusement park 10. When a component (e.g., a hardware component 22 or a software component 24) is introduced, updated, or otherwise changed within the amusement park 10, the component may be registered with the amusement park 10 such that the component may interact (e.g., communicate) with other components of the amusement park 10. That is, the one or more controllers 28 may include various protocols to send and receive information to and from components of the amusement park 10 as discussed in further detail with reference to FIG. 2.

Figure 2:
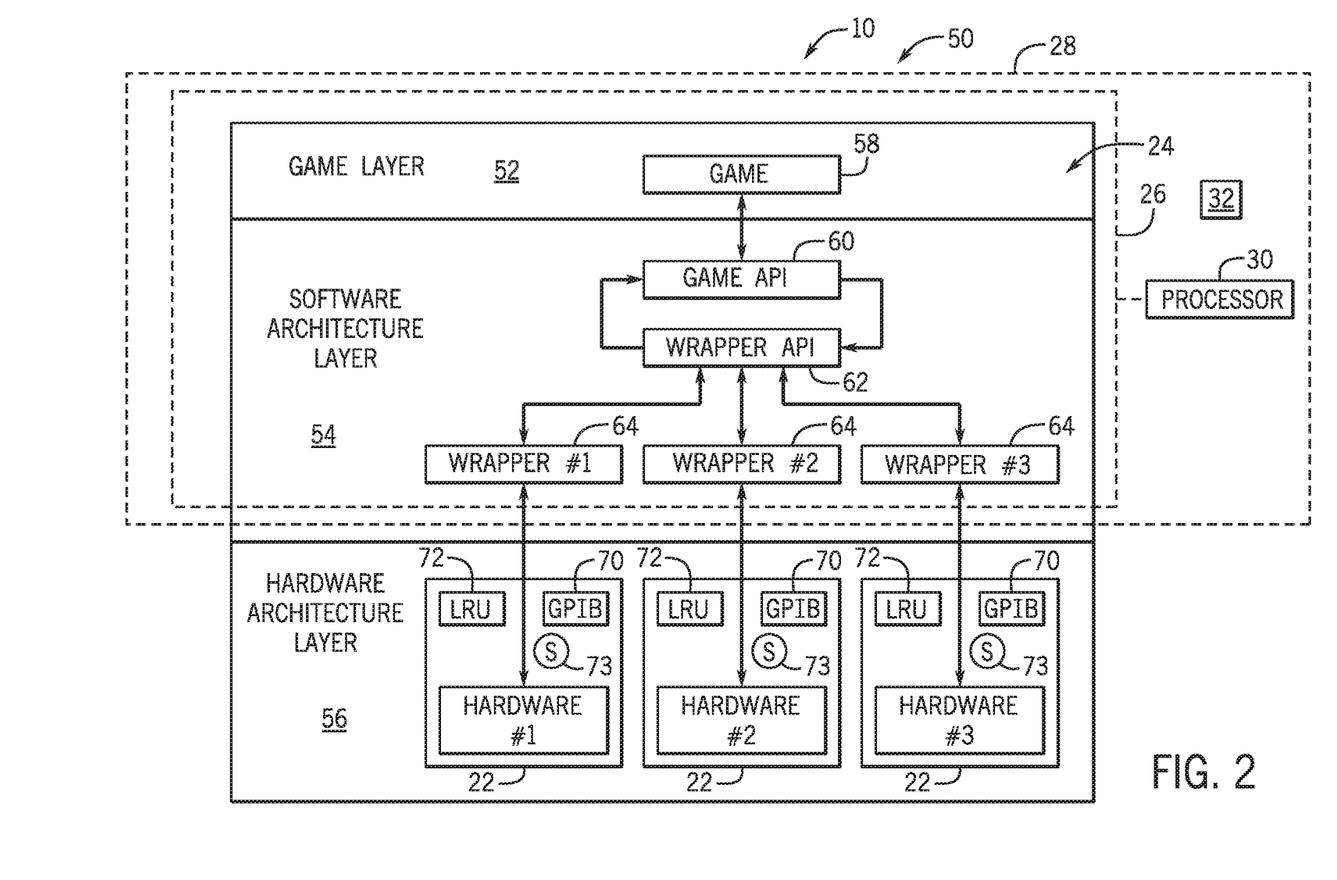
FIG. 2 is a block diagram of a controller of the amusement park of FIG. 1, in accordance with an embodiment of the present disclosure.

FIG. 2 is a block diagram of a system architecture of an amusement park system 50 of the amusement park 10. The amusement park system 50 may be separated between a game layer 52, a software layer 54 (e.g., a software architecture layer), and a hardware layer 56 (e.g., a hardware architecture layer). The game layer 52 and the software layer 54 may each be stored within the memory 26 of the controller 28. The game layer 52 and the software layer 54 may be communicatively coupled to the hardware layer 56 via the communication system 32. The game layer 52 may include a game logic 58, which determines logic of when an attraction 12 interacts with, changes, and/or manipulates elements (e.g., hardware components 22 and/or software components 24) of the attractions 12. That is, the game layer 52 may operate and execute game logic 58.

The software layer 54 may include one or more game application programming interfaces (APIs) 60, one or more wrapper APIs 62, and multiple wrappers 64. The game API 60 may define an interface language set that any game implementation (e.g., game logic 58 of a particular attraction 12) can use to communicate with the software layer 54 and the hardware layer 56. For example, the game logic 58 may communicate with the game API 60 to trigger various environmental stimuli (e.g., reactions carried out through the hardware components 22) within the amusement park 10.

The wrapper API 62 may route messages from the game API 60 to the wrappers 64. The wrappers 64 are software elements that conform, extend, and/or implement a standard interface class and are configured to register with the wrapper API 62 to receive the messages associated with the environmental stimuli. The wrappers 64 may communicate with a driver associated with a particular hardware component 22 so that the hardware component 22 may receive the messages associated with environmental stimuli. In certain embodiments, each hardware component 22 may be associated with one or more respective wrappers 64. The wrappers 64 may serve as a buffer between the hardware components 22 of the hardware layer 56 and the software components 24 of the software layer 54. For example, when the hardware components 22 are updated or changed, the change or update will not impact operations, logic, and/or builds of the software components 24. Conversely, as software components 24 are updated, the wrappers 64 may reduce and/or prevent the need to update the hardware components 22 to be compatible with the updated software components 24. In certain embodiments, additional hardware components 22 or features may be added. In such embodiments, one or more wrappers 64 associated with the newly added hardware components may also be added to the software layer 54. The newly added wrappers 64 may then be registered with the wrapper API 62 to be able to receive stimulus signals (e.g., messages, events).

The hardware layer 56 may include the hardware components 22 which, as discussed herein, are configured to be easily replaceable and/or updatable. That is, the hardware components 22 may utilize a modular design (e.g., composed of standardized units), standard (e.g., universal) mounting points, and dynamic internal configurations to improve implementation of new hardware components 22 and updates to existing hardware components 22. For example, the hardware components 22 may utilize a general purpose interface bus (GPIB) 70 (e.g., general purpose interface (GPI)), which may form part of the communication system 32, to communicate with components within the software layer 54 and other hardware components 22 within the hardware layer 56. Indeed, in certain embodiments, the hardware components may utilize a wired communications network. In another example, the hardware component 22 may utilize a wireless communications network as provided herein. In some embodiments, the hardware components 22 may communicate without the use of a network, such as by direct or broadcast communications through wired and/or wireless means. As a further example, the hardware components 22 may utilize and/or be a line replaceable unit (LRU) 72, which is a modular component that is easily replaceable. Particularly, the LRU 72 may be quickly replaced at the attraction 12 (e.g., "on the line") which may provide for decreased downtime of the attraction 12. Indeed, the hardware components 22 within the hardware layer 16 may utilize, for example, a limited number (e.g., one) of types of power supply, a limited number (e.g., one) of types of input and output modules, and a limited number of other components. In this manner, if a portion (or all) of a hardware component 22 should be added or changed, the portion may easily be implemented due at least in part to the standard (e.g., general, universal, modular) components. The modular design of the hardware components 22 may be based on standards, guidelines, and best practices to ensure correct implementation. In certain embodiments, the hardware components 22 may provide self-testing. That is, the hardware component 22 may determine if it is suitable to continue operation. For example, the hardware component 22 may include one or more sensors 73 configured to monitor inputs and outputs of the hardware component 22 to determine the operational status of the hardware component 22, such as whether the hardware component 22 is operating as intended and/or if a part within the hardware component 22 should be replaced/updated, such as if the hardware component 22 is nearing an end of its product lifecycle.

By way of example, the hardware element 22 may be a weapon element of an attraction 12 within the amusement park 10. One or more of the sensors 73 of the hardware element may detect the user input of a trigger actuation to cause the weapon to fire at a target. Based on the firing, other hardware components 22, such as targets, may detect a successful hit or an unsuccessful hit. The input signal caused by the weapon firing and any target hits may be communicated via the software layer 54 to the game layer 52 to associate the successful hit with a particular user to in turn provide output signals back through the software architecture layer 54 to the hardware layer 56 to cause the target, for example, to light up or actuate. That is, the input of a user actuation of a weapon may cause an output of a target actuation. Certain attraction runs may include enhanced weapons with new capabilities, and the game logic may receive the actuation signals through the appropriate wrapper 64 to cause the target actuation. If an upgraded weapon has a blast or other enhanced capability, the game logic 58 may unlock new types of hardware components 22 that are typically stationary or may cause new movement scenarios for the targets. However, the absence of such enhanced features during normal game runs does not interfere with the ability to operate the attraction 12. Further, the system 50 is capable of rapidly handling the incorporation of new hardware components 22 for special attraction runs along with a smooth return to normal operations. The software layer 54 facilitates the communication to and from the hardware components 22 such that the input signals are received in a plug and play manner by the game logic 58.

Figure 3:
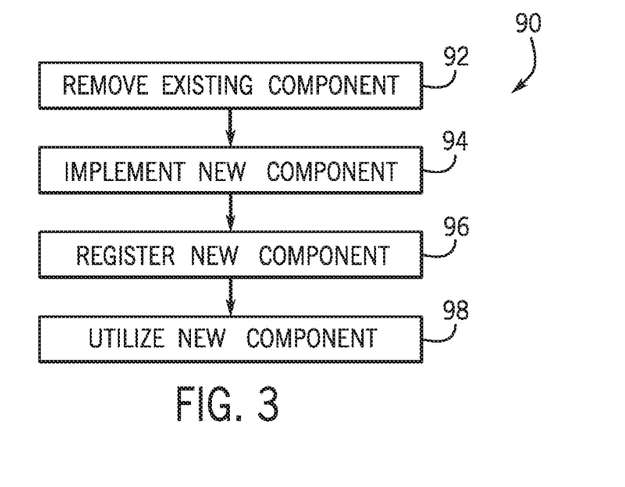
FIG. 3 is a flow chart of a process for implementing a new component with the amusement park of FIG. 1, in accordance with an embodiment of the present disclosure.

FIG. 3 is a flow chart of a component implementation process 90 that may occur within the amusement park 10. In some embodiments, implementation of a new component may be caused at least in part by one or more changing factors. As discussed herein, a new technology release/update, a particular time of year, movie/video game release, maintenance, and so forth may motivate amusement park personnel to change an attraction 12. For example, a seasonal change, such as from fall to winter, may motivate a change from a Halloween-themed attraction 12 to a snow-themed attraction 12.

In certain embodiments, the component implementation process 90 may start with removal of an existing (e.g., previously installed) component (block 92). For example, if the new component being implemented is an animatronic show piece, an existing (e.g., previously installed) animatronic show piece may first be removed. When the existing component is removed, the amusement park system 50 may receive a signal indicative of the removal (or, based on a lack of a signal from the element, may update the system to indicate removal). To illustrate, before the occurrence of block 92 (e.g., before the existing animatronic show piece is removed), a show clock of the attraction 12 associated with the animatronic show piece may have been configured to schedule a stop of a ride vehicle adjacent to the animatronic show piece to enable viewing and/or interaction of riders with the animatronic show piece. However, upon removal of the animatronic show piece, the system may receive an input indicative of the removal, and the system may update the show clock to remove the scheduled stop of the ride vehicle adjacent to the former location of the animatronic show piece. In this manner, the interoperability of the various hardware components may be dynamically updated based on a change in ride configuration.

At block 94, the new component may be implemented (e.g., installed, plugged in, uploaded). In certain embodiments, the component being implemented and the existing component may each utilize LRUs 72, as discussed herein. Indeed, the new component may be easily implemented using the same connections as the existing component, thereby increasing an efficiency of the component implementation process 90, and decreasing a downtime of the attraction 12 in which the component implementation process 90 is occurring. Moreover, in certain embodiments, the component implementation process 90 may start with the installation of the new component (block 94). That is, it should be understood that it is not necessary for a component to be removed before a new component is installed. Indeed, the new component may simply be an addition to the amusement park 10.

At block 96, the new component may be registered (e.g., auto-configured) with the amusement park system 50. When a new component is implemented (e.g., plugged in), the system may receive an indication that the new component is implemented and may know how to interact with the new component. That is, the new component and its associated functions (e.g., movement functions, display functions, special effect functions, etc.) may be registered with the system such that the new component and its associated functions may be utilized by the amusement park system 50. In certain embodiments, the auto-configuration (e.g., the registration) performed at block 96 may be performed without user interaction with the amusement park system 50. Indeed, once the component is implemented (block 94), if the component is a hardware component 22, the wrappers 64 may identify the hardware component 22 and its associated functions and may notify the amusement park system 50 that the hardware component 22 is implemented so that the amusement park system 50 may now utilize the hardware component 22 (block 96). In some embodiments, registration (block 96) of the functions of a hardware component may correspondingly register the component as an input peripheral device and/or as an output peripheral device. Similarly, if the component is a software component 24 (e.g., an operating system update), once installed, the amusement park system 50 may selectively utilize the software component 24 and its associated functions.

Overall, once a new component is registered, the component may generate and receive events (e.g., communicative signals). Particularly, the amusement park system 50 may communicate with the component to utilize the registered functions of the new component (block 98). In certain embodiments, the new component may be registered utilizing an event router/manager. The event router/manager may receive events from the new component and deliver the events to other portions of the amusement park system 50. Similarly, the event router/manager may receive events from portions of the amusement park system 50 and may communicate the event to the new component. In some embodiments, events may be assigned (e.g., communicated) utilizing a flag, which may be a predefined bit or bit sequence that holds a binary value to indicate the presence of an event. That is, one or more components of the amusement park system 50 may utilize a flag to communicate with other components within the amusement park system 50. In one embodiment, a new hardware or software component may be registered as a type of a group of existing components.

In one example, a new hardware component 22 may be a holiday present structure that, at certain times of the day, lights up to indicate that prizes are available. The new component may be registered as a present and, when the system communicates via the wrappers 64 to all of the registered presents, all of the registered presents may light up. The presents may be distributed throughout the amusement park 10, and the system may, in a modular manner, register a new present, and communicate to all of the components registered as presents to drive a common operation, such as a light up function, regardless of their location within the amusement park 10. Further, the new hardware component may have additional functionality, such as an animatronic opening feature. The system 50 may send an activation signal to all of the presents, and, for the presents with enhanced functionality, the activation signal may also drive the operation of the animatronic opening feature as well as the light up feature. For presents without the enhanced functionality, the activation signal triggers the light up feature only.

Figure 4:
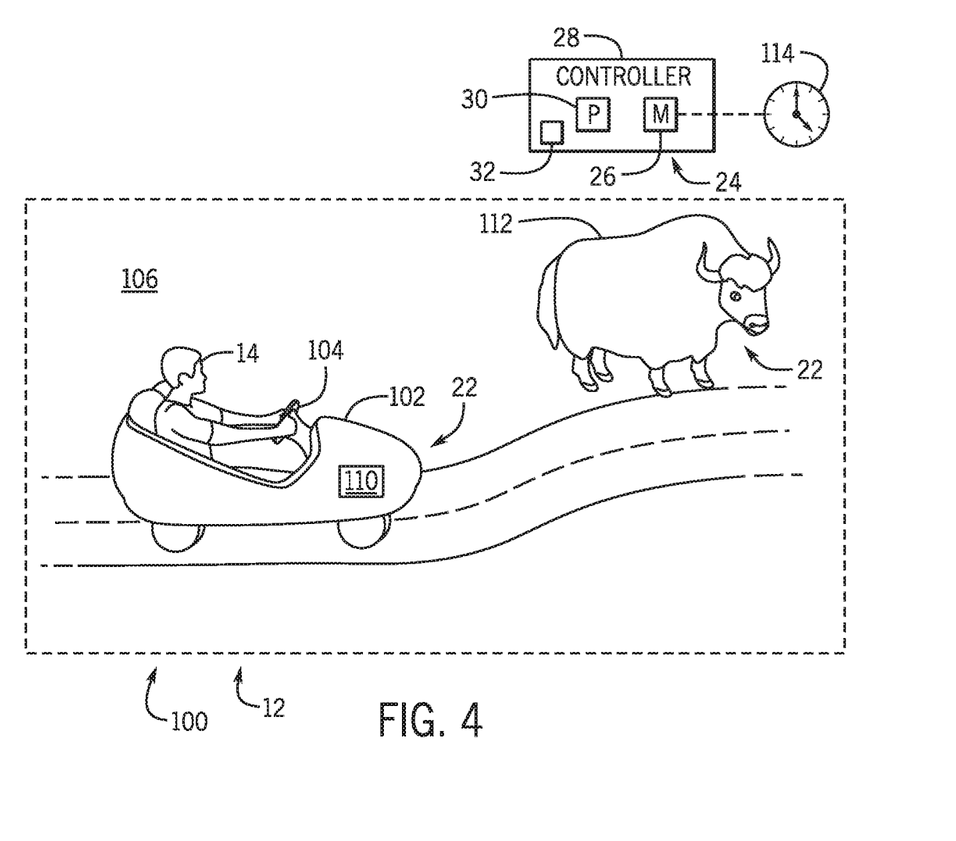
FIG. 4 is a schematic view of an amusement park attraction of the amusement park of FIG. 1, in accordance with an embodiment of the present disclosure.

FIG. 4 is a schematic view of a group of components 100 that may be included in one or more of the attractions 12 of FIG. 1. The group of components 100 in the illustrated embodiment may include a variety of software components 24 and hardware components 22 that may be organized and communicatively coupled utilizing the hierarchical system architecture of the amusement park system 50 described in reference to FIG. 2. In the illustrated embodiment, the group of components 100 may include a ride vehicle 102, a steering wheel 104, a game floor 106, a special effects system 110, an animatronic show piece 112, a show clock 114, and other components. In certain embodiments, each component of the attraction 12 may be associated with one or more software components 24 and one or more hardware components 22. As discussed herein, components of the group of components 100 may be updated utilizing the methodology described in reference to FIG. 3.

For example, the game floor 106 may be an interactive game floor (e.g., a hardware component 22) capable of providing (e.g., displaying) a variety of games in response to one or more signals provided by one or more software components 24. In certain embodiments, one or more software components 24 within the game layer 52 and/or the software layer 54 may be updated such that the game floor 106 may provide a new game. When a software component 24 associated with the display of the game floor 106 is updated, the game floor 106 may automatically start communicating (e.g., receiving/sending signal/events) with the new software component 24 to display the new game. In certain embodiments, implementation of a change in a software component 24 may include registration of new executable code. Similarly, in certain embodiments, the hardware components 22 of the game floor 106 may be updated. For example, the game floor 106 may be updated to include a new animatronic show piece 112 on the game floor 106. Due at least in part to the structure and modularity of the amusement park system 50, the animatronic show piece 112 may automatically start generating and receiving signals once implemented (e.g., plugged in) within the attraction 12.

As a further example, the steering wheel 104 may be an input device which may provide directional control to the ride vehicle 102. In certain embodiments, the steering wheel 104 may send one or more signals indicative of the direction that the ride vehicle 102 is being steered to the controller 28. Based on the direction of the ride vehicle 102, the controller 28 may implement various effects, such as redirecting the ride vehicle 102, increasing or decreasing a score, and so forth. In a certain embodiment, the steering wheel 104 may be updated to account for a different type of game. For example, the game type may be updated from a simple driving game to a game with virtual tools, which may be utilized via user 14 interaction with input devices (e.g., buttons) located on the steering wheel 104. In such embodiments, the original (e.g., old, existing) steering wheel 104 may be removed and replaced with the updated steering wheel 104 with the input devices. When the new steering wheel 104 is implemented (e.g., plugged in), the new steering wheel 104 may be registered with the amusement park system 50 and may generate and/or receive events henceforth.

Indeed, the events (e.g., signals) generated and/or received by the original steering wheel 104 may be different than the events (e.g., signals) generated and/or received by the new steering wheel 104. For example, the original steering wheel 104 may be configured to receive direction signals (e.g., through user input) indicative of a driving direction of the ride vehicle 102. Moreover, the new steering wheel 104 may be configured to generate multiple types of signals based on activation of the input devices (e.g., buttons, knobs, touch screens, etc.) included in the new steering wheel 104. For example, beyond direction control, actuation of the input devices of the new steering wheel may generate special effect signals indicative of one or more special effects (e.g., light effects, vibration effects, mist effects, sound effects, etc.) of the special effects system 110. When the new steering wheel 104 generates signals to activate the special effects based on user input, the controller 28 may receive the signals to actuate the respective special effects of the special effects system 110. Further, as used herein, it should be noted that inputs provided by a user 14 to hardware components 22 (e.g., input peripheral devices) of the amusement park system 50 may include biometric inputs, which may include body/gesture tracking.

Moreover, in certain embodiments, the attraction 12 shown in FIG. 4 may be a path-based ride attraction 12 including one or more of the animatronic show pieces 112 that are configured to be actuated based on input (e.g., signals) provided by the show clock (e.g., a software component 24) 114. That is, the show clock 114 may be configured to provide signals to actuate the animatronic show pieces 112 such that the animatronic show pieces 112 are actuated, or perform a function, when one or more of the ride vehicles 102 are within a particular distance threshold from the animatronic show piece 112. In other words, the show clock 114 may keep one or more schedules such that the animatronic show pieces 112 are scheduled to actuate when one of the ride vehicles 102 is within a particular range of the animatronic show piece 112.

Additionally, the show clock may keep one or more schedules to actuate one or more effects of the ride vehicles 102 when the ride vehicles 102 are within the particular distance threshold of the animatronic show piece 112. For example, the show clock 114 may be configured to cause the ride vehicle 102 to vibrate, stop movement, or cause the occurrence of another special effect of the special effect system 110 when the ride vehicle 102 is within the particular distance threshold. In certain embodiments, the show clock 114 may be updated based on one or more new components being implemented and registered with the amusement park system 50. For example, in some embodiments, a particular animatronic show piece 112 may be removed from the attraction 12. Upon removal of the particular animatronic show piece 112, the amusement park system 50 may determine that the particular animatronic show piece 112 has been removed and the controller 28 may send a signal to the show clock 114 to update the schedule of the show clock 114 such that the ride vehicle 102 does not stop, vibrate, or incur a special effect when the ride vehicle 102 is within the particular distance threshold of the former location of the particular animatronic show piece 112.

Still further, as discussed herein, a component, such as an animatronic show piece 112 may be replaced if the attraction 12 is to be updated. Particularly, an original animatronic show piece 112 (e.g., a hardware component 22) may be replaced with an updated animatronic show piece 112. In such embodiments, the original animatronic show piece 112 may be associated with a first set of functions and special effects, and the updated animatronic show piece 112 may be associated with a second set of functions and special effects. For example, the original animatronic show piece 12 may be capable of actuating one or more of a plurality of limbs and may eject water while the updated animatronic show piece 112 may be capable of one or more of a plurality of limbs, may emit certain light effects, may emit certain sound effects, and may eject steam. In certain embodiments, when the updated animatronic show piece 112 is implemented, the updated animatronic show piece 112 may utilize the same connections as the original animatronic show piece 112. That is, as discussed herein, both the original animatronic show piece 112 and the updated animatronic show piece 112 may utilize LRUs 72, standard mounting points, a modular design, and other features to increase an efficiency of replacing (e.g., updating) the original animatronic show piece 112. When the updated animatronic show piece 112 replaces the original animatronic show piece 112, the new animatronic show piece 112 may be registered with the amusement park system 50 such that the updated animatronic show piece 112 may generate and receive events (e.g., signals) to communicate with the amusement park system 50. Once implemented and registered, the amusement park system 50 may receive a notification of the available functions of the updated animatronic show piece 112 and may be configured to activate (e.g., send events/signals via one or more of the wrappers 64) the available functions of the updated animatronic show piece 112. Further it should be noted that, in some embodiments, only one or more portions of the original component (e.g., original animatronic show piece 112) may be updated (e.g., replaced) to update the original component.

It should be understood that while certain examples used herein discuss the use of particular hardware components 22 and software components 24 such as the ride vehicle 102, the steering wheel 104, the game floor 106, the special effects system 110, the animatronic show piece 112, the show clock 114, and so forth, the associated methodology, such as the component implementation process 90 (FIG. 3) for changing or updating the components, may be applied to any other suitable component within the amusement park

10. Generally, a change of a component (e.g., hardware component 22 and/or software component 24) may register functions associated with the change of the component such that the amusement park system 50 may selectively drive the functions.

While only certain features of the present embodiments have been illustrated and described herein, many modifications and changes will occur to those skilled in the art. It is, therefore, to be understood that the appended claims are intended to cover all such modifications and changes as fall within the true spirit of the present disclosure. Further, it should be understood that certain elements of the disclosed embodiments may be combined or exchanged with one another.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:
1. An amusement park system, comprising:
a plurality of hardware components; and
a controller, comprising:
a memory device having a game layer and a software layer stored thereon, wherein the game layer comprises game logic, and wherein the software layer comprises a game application programming interface (API) communicatively coupled to the game layer, a wrapper API communicatively coupled to the game API, a plurality of wrappers communicatively coupled to the wrapper API, and a show clock configured to generate a clock signal when a ride vehicle is within range of one or more hardware components of the plurality of hardware components, wherein each hardware component of the plurality of hardware components is associated with a corresponding individual wrapper of the plurality of wrappers; and
a processor configured to execute instructions stored on the memory device, wherein the instructions are configured to cause the processor to:
receive a signal indicative of a change in the one or more hardware components of the plurality of hardware components of the amusement park system;
adjust operation of the show clock based at least in part on the signal; and
communicate with the one or more hardware components the individual hardware component of the plurality of hardware components, based on the received signal, via one or more corresponding wrappers of the plurality of wrappers to receive an input from the plurality of hardware components, or drive operation of the plurality of hardware components and wherein the one or more hardware components are configured to actuate based in part on the clock signal.
2. The amusement park system of claim 1, wherein the change in the one or more hardware components of the plurality of hardware components of the amusement park system comprises an addition of a new hardware component to the plurality of hardware components or an update of an existing hardware component of the plurality of hardware components.

3. The amusement park system of claim 2, wherein the new hardware component is configured to communicate using a same communication channels used by at least one individual hardware component of the plurality of hardware components.

4. The amusement park system of claim 1, wherein the change in the one or more hardware components of the plurality of hardware components comprises implementation of a new function of the one or more hardware components of the plurality of hardware components.

5. The amusement park system of claim 4, wherein the implementation causes driving the new function of the one or more hardware components of the plurality of hardware components.

6. The amusement park system of claim 1, further comprising one or more software components, wherein the instructions are configured to cause the processor to receive a second signal indicative of a second change in the one or more software components.

7. The amusement park system of claim 6, wherein the second change in the one or more software components comprises implementation of a new function of the one or more software components, and wherein the processor is configured to drive the new function upon receipt of the second signal.

8. The amusement park system of claim 1, wherein the one or more hardware components of the plurality of hardware components comprises a line replaceable unit (LRU).

9. The amusement park system of claim 1, wherein the one or more hardware components of the plurality of hardware components comprises one or more general purpose interface buses (GPIBs).

10. The amusement park system of claim 1, wherein the one or more hardware components is configured to self-test to determine an operational status of the one or more hardware components of the plurality of hardware components.

11. The amusement park system of claim 1, wherein the clock signal causes the one or more hardware components to actuate based on the ride vehicle being within a distance threshold from the one or more hardware components.

12. An amusement park configured to host a plurality of users and comprising:
   a show clock configured to generate a clock signal when a ride vehicle is within range of one or more interactive components;
   a plurality of attractions, wherein an attraction of the plurality of attractions comprises a plurality of hardware components, wherein each hardware component of the plurality of hardware components is configured to move based in part on the clock signal; and
   a controller, comprising:
      a memory device; and
      a processor configured to execute instructions stored on the memory device, wherein the instructions are configured to cause the processor to:
         receive a signal indicative of an implementation of one or more new hardware components of the plurality of hardware components within the attraction of the plurality of attractions;
         adjust operation of the show clock based at least in part on the signal; and
         register the one or more new hardware components of the plurality of hardware components upon receipt of the signal, wherein, upon registration of the one or more new hardware components of the plurality of hardware components, the processor is configured to process input signals received from the one or more new hardware components of the plurality of hardware components, drive operations of the one or more new hardware components of the plurality of hardware components, or a combination thereof, wherein the processor communicates with the one or more new hardware of the plurality of hardware components via one or more corresponding wrappers of a plurality of wrappers of the one or more new hardware components of the plurality hardware components that is coupled to a game application programming interface (API) through a wrapper API.

13. The amusement park of claim 12, wherein implementation of the one or more new hardware components of the plurality of hardware components automatically triggers the registration of the one or more new hardware components of the plurality of hardware components.

14. The amusement park of claim 12, wherein the registration of the one or more new hardware components of the plurality of hardware components registers a set of functions of the one or more new hardware of the plurality of hardware components with the controller such that the controller is configured to selectively drive the set of functions.

15. The amusement park of claim 12, wherein, once registered, one or more new interactive components of a plurality of interactive components is configured to receive an input from a user of the plurality of users and to generate an input signal based on the received input from the user, and wherein the controller is configured to drive a function of the one or more new hardware component of the attraction of the plurality of attractions based on the generated input signal of the one or more new interactive components of the plurality of interactive components.

16. The amusement park of claim 12, comprising a group of existing components associated with one or more types of components, wherein the one or more new hardware components of the plurality of hardware components is associated with the one or more types of components, and wherein registration of the one or more new hardware components of the plurality of hardware components registers the one or more new hardware components of the plurality of hardware components as the one or more types of components.

17. The amusement park of claim 16, wherein the controller is configured to drive an operation associated with both the group of existing components and with the one or more new hardware components of the plurality of hardware components upon registration of the one or more new hardware components of the plurality of hardware components.

18. The amusement park of claim 16, wherein registration of the one or more new hardware components of the plurality of hardware components comprises automatically transferring associated functions.

* * * * *